(12) United States Patent
Eid et al.

(10) Patent No.: US 8,031,879 B2
(45) Date of Patent: Oct. 4, 2011

(54) SOUND PROCESSING SYSTEM USING SPATIAL IMAGING TECHNIQUES

(75) Inventors: Bradley F. Eid, Greenwood, IN (US); William Neal House, Greenwood, IN (US)

(73) Assignee: Harman International Industries, Incorporated, Northridge, CA (US)

( * ) Notice: Subject to any disclaimer, the term of this patent is extended or adjusted under 35 U.S.C. 154(b) by 1618 days.

(21) Appl. No.: 11/299,592

(22) Filed: Dec. 12, 2005

(65) Prior Publication Data

US 2006/0088175 A1    Apr. 27, 2006

Related U.S. Application Data

(60) Division of application No. 10/210,155, filed on Jul. 31, 2002, now Pat. No. 7,206,413, which is a continuation-in-part of application No. 09/850,500, filed on May 7, 2001, now Pat. No. 6,804,565.

(51) Int. Cl.
*H04B 1/00* (2006.01)
(52) U.S. Cl. ............... 381/86; 381/27; 381/119; 381/20
(58) Field of Classification Search .................... 328/27, 328/86, 302, 20, 123; 381/27, 86, 302, 20, 381/123, 119, 104, 307, 300, 71.4, 73.1, 381/1, 111, 17, 18, 19, 21, 22, 23
See application file for complete search history.

(56) References Cited

U.S. PATENT DOCUMENTS

| | | |
|---|---|---|
| 3,845,572 A | 11/1974 | McCanney |
| 4,251,688 A | 2/1981 | Furner |
| 4,382,158 A | 5/1983 | Ohshita et al. |
| 4,641,344 A * | 2/1987 | Kasai et al. ..................... 381/57 |
| 4,759,066 A | 7/1988 | Polk et al. |
| 4,761,814 A | 8/1988 | Sgai et al. |
| 4,799,260 A | 1/1989 | Mandell et al. |
| 4,837,825 A | 6/1989 | Shivers |
| 4,862,502 A | 8/1989 | Griesinger |
| 4,866,776 A | 9/1989 | Kasai et al. |
| 4,882,753 A | 11/1989 | Shivers |

(Continued)

FOREIGN PATENT DOCUMENTS

EP    1 067 680 A2    1/2001

(Continued)

OTHER PUBLICATIONS

Griesinger, David, "Practical Processors and Programs for Digital Reverberation," *Proceedings of the AES 7th International Conference, Audio Engineering Society*, Toronto, May 1989, pp. 187-195.

(Continued)

*Primary Examiner* — Vivian Chin
*Assistant Examiner* — Con P Tran
(74) *Attorney, Agent, or Firm* — Brinks Hofer Gilson & Lione

(57) ABSTRACT

A sound processing system reduces the instances when only a center speaker is heard. The gain of a volume setting is adjusted for individual speakers in response to one or more input signals. The gain of the center speaker is attenuated in relation to the global volume setting. In addition or as an alternative, the gain of front and/or rear speakers is increased. A virtual center channel is generated for locations where the center speaker may not be heard.

30 Claims, 8 Drawing Sheets

U.S. PATENT DOCUMENTS

| | | | |
|---|---|---|---|
| 4,891,839 A | 1/1990 | Scheiber | |
| 4,905,283 A | 2/1990 | Ishikawa et al. | |
| 4,932,059 A | 6/1990 | Fosgate | |
| 4,940,977 A | 7/1990 | Mandell | |
| 4,941,177 A | 7/1990 | Mandell et al. | |
| 4,953,213 A | 8/1990 | Tasaki et al. | |
| 4,972,482 A | 11/1990 | Ishiguro et al. | |
| 5,046,098 A | 9/1991 | Mandell et al. | |
| 5,068,897 A | 11/1991 | Yamato et al. | |
| 5,109,416 A | 4/1992 | Croft | |
| 5,109,419 A | 4/1992 | Griesinger | |
| 5,119,422 A | 6/1992 | Price | |
| 5,136,650 A | 8/1992 | Griesinger | 381/22 |
| 5,146,507 A | 9/1992 | Satoh et al. | |
| 5,161,197 A | 11/1992 | Griesinger | |
| 5,172,415 A | 12/1992 | Fosgate | |
| 5,189,703 A | 2/1993 | Holman | |
| 5,193,118 A | 3/1993 | Latham-Brown et al. | |
| 5,199,075 A | 3/1993 | Fosgate | |
| 5,222,143 A | 6/1993 | Min | |
| 5,263,087 A | 11/1993 | Fosgate | |
| 5,274,740 A | 12/1993 | Davis et al. | |
| 5,280,528 A | 1/1994 | Fosgate | |
| 5,295,189 A | 3/1994 | Fosgate | |
| 5,301,237 A | 4/1994 | Fosgate | |
| 5,307,415 A | 4/1994 | Fosgate | |
| 5,319,713 A | 6/1994 | Waller, Jr. et al. | |
| 5,333,201 A | 7/1994 | Waller, Jr. | |
| 5,337,196 A | 8/1994 | Kim | |
| 5,339,363 A | 8/1994 | Fosgate | |
| 5,386,473 A | 1/1995 | Harrison | |
| 5,400,433 A | 3/1995 | Davis et al. | |
| 5,412,732 A | 5/1995 | Kanishi et al. | |
| 5,428,687 A | 6/1995 | Willcocks et al. | |
| 5,463,424 A | 10/1995 | Dressler | |
| 5,467,399 A | 11/1995 | Whitecar | |
| 5,497,425 A | 3/1996 | Rapoport | |
| 5,504,819 A | 4/1996 | Fosgate | |
| 5,524,054 A | 6/1996 | Spille | |
| 5,533,129 A | 7/1996 | Gefvert | |
| 5,557,680 A | 9/1996 | Janes | |
| 5,581,621 A | 12/1996 | Koyama et al. | |
| 5,583,962 A | 12/1996 | Davis et al. | |
| 5,594,800 A | 1/1997 | Gerzon | |
| 5,610,985 A | 3/1997 | Ten Kate | |
| 5,617,480 A | 4/1997 | Ballard et al. | |
| 5,625,696 A | 4/1997 | Fosgate | |
| 5,638,452 A | 6/1997 | Waller, Jr. | |
| 5,642,423 A | 6/1997 | Embree | |
| 5,644,640 A | 7/1997 | Fosgate | |
| 5,666,424 A | 9/1997 | Fosgate et al. | |
| 5,680,468 A * | 10/1997 | Van Hout et al. | 381/86 |
| 5,684,879 A | 11/1997 | Verdick | |
| 5,708,719 A | 1/1998 | Greenberger et al. | |
| 5,727,067 A | 3/1998 | Iwamatsu | |
| 5,727,068 A | 3/1998 | Karagosian et al. | |
| 5,748,746 A | 5/1998 | Ozaki et al. | |
| 5,757,928 A | 5/1998 | Schaar | |
| 5,761,313 A | 6/1998 | Schott | |
| 5,764,777 A | 6/1998 | Goldfarb | |
| 5,768,394 A | 6/1998 | Heo | |
| 5,771,295 A | 6/1998 | Waller, Jr. | |
| 5,796,844 A | 8/1998 | Griesinger | |
| 5,798,818 A | 8/1998 | Derderian et al. | |
| 5,802,181 A | 9/1998 | Ozaki et al. | |
| 5,809,150 A | 9/1998 | Eberbach | |
| 5,841,993 A | 11/1998 | Ho | |
| 5,850,455 A | 12/1998 | Arnold et al. | |
| 5,850,457 A | 12/1998 | Gefvert | |
| 5,862,228 A | 1/1999 | Davis | |
| 5,870,480 A | 2/1999 | Griesinger | |
| 5,883,961 A | 3/1999 | House et al. | |
| 5,887,071 A | 3/1999 | House | |
| 5,930,370 A | 7/1999 | Ruzicka | |
| 5,974,380 A | 10/1999 | Smyth et al. | |
| 5,983,087 A | 11/1999 | Milne et al. | |
| 6,032,081 A | 2/2000 | Han et al. | |
| 6,038,324 A | 3/2000 | Ambourn | |
| 6,038,330 A | 3/2000 | Meucci, Jr. | |
| 6,075,868 A | 6/2000 | Goldfarb et al. | |
| 6,108,584 A | 8/2000 | Edwards | |
| 6,118,876 A | 9/2000 | Ruzicka | |
| 6,122,381 A | 9/2000 | Winterer | |
| 6,141,597 A | 10/2000 | Botzko et al. | |
| 6,144,747 A | 11/2000 | Scofield et al. | 381/309 |
| 6,150,597 A | 11/2000 | Kakishita et al. | |
| 6,154,549 A | 11/2000 | Arnold et al. | |
| 6,157,725 A | 12/2000 | Becker | |
| 6,195,435 B1 | 2/2001 | Kitamura | |
| 6,198,826 B1 | 3/2001 | Cowieson et al. | |
| 6,332,026 B1 | 12/2001 | Kuusama et al. | |
| 6,363,155 B1 * | 3/2002 | Horbach | 381/17 |
| 6,381,335 B2 | 4/2002 | Juszkiewicz et al. | |
| 6,442,277 B1 | 8/2002 | Lueck et al. | |
| 6,442,278 B1 | 8/2002 | Vaudrey et al. | |
| 6,449,368 B1 | 9/2002 | Davis et al. | |
| 6,453,047 B1 | 9/2002 | Dicker et al. | |
| 6,466,913 B1 | 10/2002 | Yasuda et al. | |
| 6,470,087 B1 | 10/2002 | Heo et al. | |
| 6,496,584 B2 | 12/2002 | Irwan et al. | |
| 6,498,856 B1 | 12/2002 | Itabashi et al. | |
| 6,501,717 B1 | 12/2002 | Yamazaki | |
| 6,501,843 B2 | 12/2002 | Usui et al. | |
| 6,539,357 B1 | 3/2003 | Sinha | |
| 6,556,685 B1 | 4/2003 | Urry et al. | |
| 6,577,736 B1 | 6/2003 | Clemow | |
| 6,584,202 B1 | 6/2003 | Montag et al. | |
| 6,587,565 B1 | 7/2003 | Choi | |
| 6,590,983 B1 | 7/2003 | Kraemer | |
| 6,611,212 B1 | 8/2003 | Craven et al. | |
| 6,624,873 B1 | 9/2003 | Callahan, Jr. et al. | |
| 6,636,608 B1 | 10/2003 | Kishii et al. | |
| 6,639,989 B1 | 10/2003 | Zacharov et al. | |
| 6,650,755 B2 | 11/2003 | Vaudrey et al. | |
| 6,683,962 B1 | 1/2004 | Griesinger | |
| 6,694,027 B1 | 2/2004 | Schneider | |
| 6,697,491 B1 | 2/2004 | Griesinger | |
| 6,704,421 B1 | 3/2004 | Kitamura | |
| 6,711,266 B1 | 3/2004 | Aylward | |
| 6,760,448 B1 | 7/2004 | Gundry | |
| 6,798,889 B1 | 9/2004 | Dicker et al. | |
| 6,804,565 B2 | 10/2004 | Eid | |
| 6,816,597 B1 | 11/2004 | Kawano | |
| 6,829,576 B2 | 12/2004 | Tsai et al. | |
| 6,850,622 B2 | 2/2005 | Maejima | |
| 6,853,732 B2 | 2/2005 | Scofield | |
| 6,928,168 B2 | 8/2005 | Kirkeby | 381/1 |
| 6,991,289 B2 | 1/2006 | House | |
| 6,996,239 B2 | 2/2006 | Wood | |
| 7,003,119 B1 | 2/2006 | Arthur | |
| 7,031,905 B2 | 4/2006 | Tanaka et al. | |
| 7,065,217 B2 | 6/2006 | Gierl et al. | |
| 7,107,211 B2 | 9/2006 | Griesinger | |
| 7,177,432 B2 | 2/2007 | Eid et al. | |
| 7,206,413 B2 | 4/2007 | Eid et al. | |
| 7,415,120 B1 * | 8/2008 | Vaudrey et al. | 381/109 |
| 7,447,321 B2 | 11/2008 | Furge et al. | 381/86 |
| 7,451,006 B2 | 11/2008 | Eid et al. | 700/94 |
| 7,760,890 B2 | 7/2010 | Furge et al. | 381/86 |
| 2002/0055796 A1 | 5/2002 | Katayama et al. | |
| 2002/0154783 A1 * | 10/2002 | Fincham | 381/17 |
| 2003/0040822 A1 | 2/2003 | Eid et al. | |
| 2003/0206639 A1 | 11/2003 | Griesinger | |
| 2004/0005064 A1 | 1/2004 | Griesinger | |
| 2004/0005065 A1 | 1/2004 | Griesinger | |
| 2004/0022392 A1 | 2/2004 | Griesinger | |
| 2004/0086130 A1 | 5/2004 | Eid et al. | |
| 2004/0179697 A1 | 9/2004 | Griesinger | |
| 2004/0228497 A1 | 11/2004 | Chen | |
| 2004/0258259 A1 | 12/2004 | Koyama | |
| 2005/0018860 A1 | 1/2005 | Furge et al. | |
| 2005/0031128 A1 | 2/2005 | Tomita et al. | |
| 2005/0031129 A1 | 2/2005 | Devantier et al. | |
| 2005/0031130 A1 | 2/2005 | Devantier et al. | |
| 2005/0031135 A1 | 2/2005 | Devantier et al. | |
| 2005/0031143 A1 | 2/2005 | Devantier et al. | |
| 2005/0063551 A1 | 3/2005 | Cheng et al. | |

| | | | |
|---|---|---|---|
| 2005/0100178 | A1 | 5/2005 | Rybicki et al. |
| 2006/0088175 | A1 | 4/2006 | Eid et al. |
| 2008/0317257 | A1 | 12/2008 | Furge et al. ............... 381/86 |
| 2008/0319564 | A1 | 12/2008 | Furge et al. ............... 700/94 |
| 2009/0220112 | A1* | 9/2009 | Fincham ............... 381/302 |

FOREIGN PATENT DOCUMENTS

| | | |
|---|---|---|
| EP | 1 387 601 A | 2/2004 |
| EP | 1 387 601 A2 | 4/2004 |
| JP | 60-145714 | 8/1985 |
| JP | 63-114599 | 5/1988 |
| JP | 63-177699 | 7/1988 |
| JP | 01-144900 | 7/1989 |
| JP | 04-035499 | 6/1992 |
| JP | 05-038000 | 2/1993 |
| JP | 06-500898 | 1/1994 |
| JP | 6-311581 | 4/1994 |
| JP | 6-311589 | 4/1994 |
| JP | 08-213861 | 8/1996 |
| JP | 09-062271 | 3/1997 |
| JP | 10-011078 | 1/1998 |
| JP | 2002-118897 | 4/2002 |
| JP | 2002-151975 | 5/2002 |
| JP | 2002199487 | 7/2002 |
| JP | 2003-299181 | 10/2003 |
| WO | WO 00/47018 | 8/2000 |
| WO | WO 02/091798 A2 | 11/2002 |
| WO | WO 02/091798 A3 | 11/2003 |

OTHER PUBLICATIONS

Griesinger, David, "Multichannel Matrix Surround Decoders for Two-Eared Listeners," *Presented at the 101st Convention of the Audio Engineering Society*, Los Angeles, Nov. 8-11, 1996, Preprint #4402, 21 pages.

Griesinger, David, "Spaciousness and Envelopment in Musical Acoustics," *Presented at the 101st Convention of the Audio Engineering Society*, Los Angeles, Nov. 8-11, 1996, Preprint #4401, 23 pages.

Griesinger, David, "Speaker Placement, Externalization, and Envelopment in Home Listening Rooms," *Presented at the 105th Convention of the Audio Engineering Society*, San Francisco, 1998, Preprint #4860, 48 pages.

Griesinger, David, "General Overiview of Spatial Impression, Envelopment, Localization, and Externalization," *Proceedings of the 15th International Conference of the Audio Engineering Society on Small Room Acoustics*, Denmark, Oct. 31-Nov. 2, 1998, pp. 136-149.

Griesinger, David, "Theory and Design of a Digital Audio Processor fro Home Use," *J. Audio Eng. Soc.*, vol. 37 No. 1/2, 1989, pp. 40-50.

Griesinger, David, "Binaural Techniques for Music Reproduction," *Proceedings of the 8th International Conference of the Audio Engineering Society*, 1990, pp. 197-207.

Griesinger, David, "Improving Room Acoustics Through Time Variant Synthetic Reverberation," *Presented at the 90th Convention of the Audio Engineering Society*, Paris, Feb. 1991, reprint #3014, 27 pgs.

Griesinger, David, "Room Impression Reverberance and Warmth in Rooms and Halls," *Presented at the 93rd Convention of the Audio Engineering Society*, San Francisco, Nov. 1992, Preprint #3383, 14 pages.

Griesinger, David, "Measures of Spatial Impression and Reverberance based on the Physiology of Human Hearing," *Proceedings of the 11th International Audio Engineering Society Conference*, May 1992, pp. 114-145.

Griesinger, David, "IALF—Binaural Measures of Spatial Impression and Running Reverberance," *Presented at the 92nd Convention of the Audio Engineering Society*, Mar. 1992, Preprint #3292, 42 pgs.

Griesinger, David, "Stereo and Surround Panning in Practice," *Presented at the 112th Convention of the Audio Engineering Society*, Munich, May 2002, 6 pages.

Griesinger, David, "Progess in 5-2-5 Matrix Systems," *Presented at the 103rd Convention of the Audio Engineering Society*, New York, Sep. 1997, 34 pages.

Griesinger, David, "Multichannel Sound Systems and Their Interaction with the Room," *Presented at the 15th International Conference of the Audio Engineering Society*, Copenhagen, Oct. 1998, pp. 159-173.

Griesinger, David, "How Loud is My Reverberation?," *Presented at the 98th Convention of the Audio Engineering Society*, Paris, Feb. 1995, 11 pages.

Griesinger, David, "Spaciousness and Localization in Listening Rooms and Their Effects on the Recording Technique," *J. Audio Eng. Soc.*, vol. 34, No. 4, 1986, pp. 255-268.

Griesinger, David, "The Psychoacoustics of Apparent Source Width, Spaciousness, and Envelopment in Performance Spaces," *Acta Acoustics*, vol. 83, 1997, pp. 721-731.

Griesinger, David, "Surround: The Current Technological Situation," *SMPTE Journal*, 2001, pp. 857-866.

Griesinger, David, "Feedback Reduction and Acoustic Enhancement Using an Inexpensive Digital Sound Processor," *Presented at the 15th International Congress on Acoustics*, Trondheim, Jun. 1995, pp. 473-476.

Griesinger, David, "The Science of Surround," *Presentation material from a speech given at McGill University*, copyright by David Griesinger, Sep. 1999, 69 pages.

Griesinger, David, "Recent Experiences With Electronic Acoustic Enhancement in Concert Halls and Opera Houses," material from David Griesinger's Internet Home Page, obtained from the Internet at: <wvvw.world.std.com/~griesngr...>, undated but prior to May 2002, 28 pages.

Griesinger, David, "The Theory and Practice of Perceptual Modeling—How to Use Electronic Reverberation to Add Depth and Envelopment Without Reducing Clarity," material from David Griesinger's Internet Home Page, obtained from the Internet at: <www.world.std.com/~griesngr...>, undated but prior to May 2002, 28 pages.

Griesinger, David, "Internet Home Page," obtained from the Internet at: <www.world.std.com/~griesnger/>, printed on Apr. 26, 2004.

Dolby Laboratories, Inc., "Surround Sound Past, Present, and Future," 1999, pp. 1-8.

\* cited by examiner

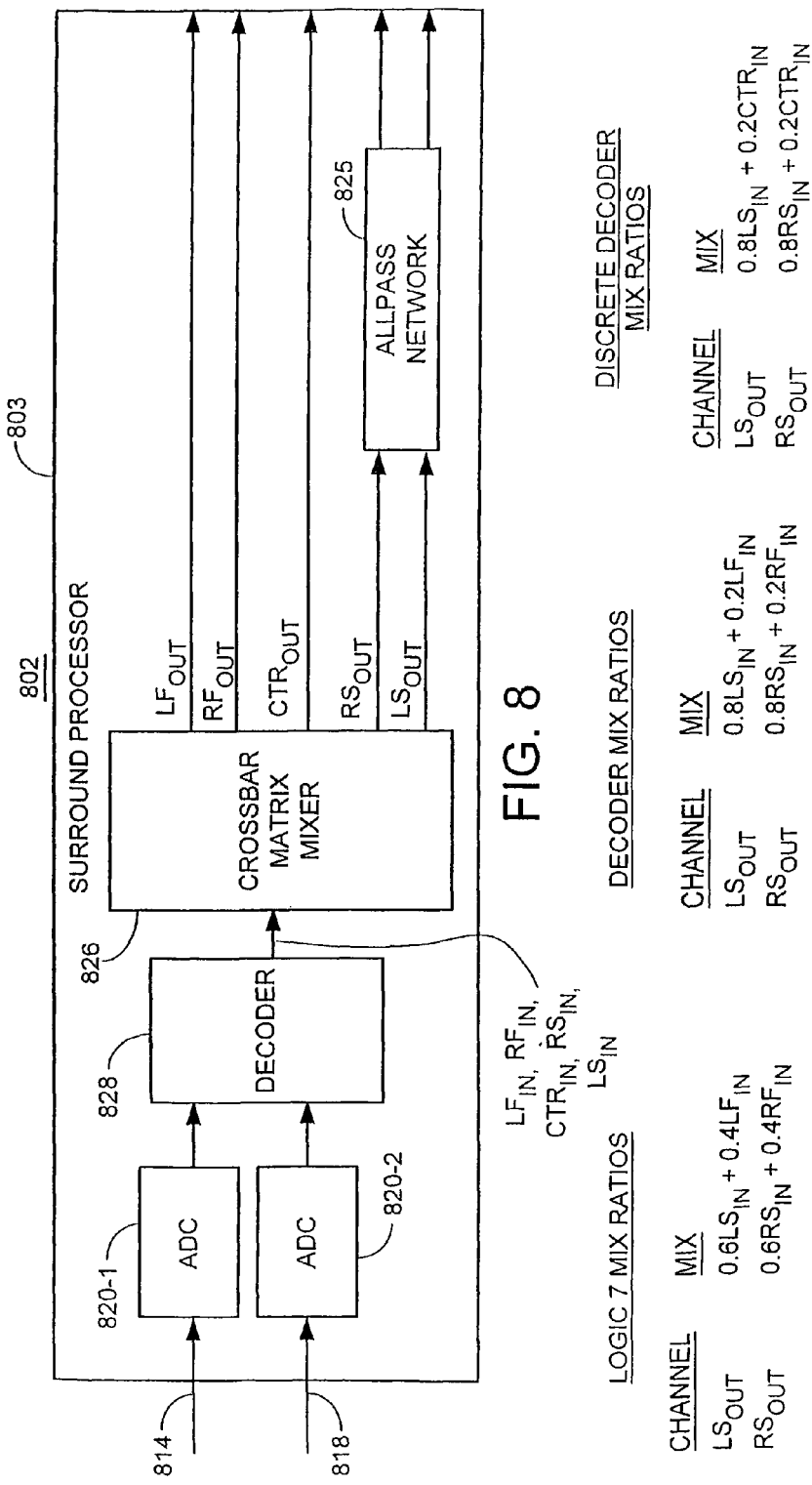

SOUND PROCESSING SYSTEM USING SPATIAL IMAGING TECHNIQUES

RELATED APPLICATIONS

This application is a divisional of U.S. patent application Ser. No. 10/210,155, entitled "Sound Processing System Using Spatial Imaging Techniques" and filed on Jul. 31, 2002 now U.S. Pat. No. 7,206,413, which is a continuation-in-part of U.S. patent application Ser. No. 09/850,500, entitled "Data-Driven Software Architecture for Digital Sound Processing and Equalization," filed on May 7, 2001 now U.S. Pat. No. 6,804,565, incorporated by reference in their entirety.

The following copending and commonly assigned U.S. patent applications were filed on the same day as U.S. patent application Ser. No. 10/210,155. All of these applications relate to and further describe other aspects of this application and are incorporated by reference in their entirety.

U.S. patent application Ser. No. 10/208,918, entitled "Sound Processing System with Degraded Signal Optimization, filed on Jul. 31, 2002.

U.S. patent application Ser. No. 10/208,930, entitled "Sound Processing System Using Distortion Limiting Techniques", filed on Jul. 31, 2002.

BACKGROUND OF THE INVENTION

1. Technical Field

The invention generally relates to sound processing systems. More particularly, the invention relates to sound processing systems having multiple outputs.

2. Related Art

Audio or sound system designs involve the consideration of many different factors. The position and number of speakers, the frequency response of each speaker, and other factors usually are considered in the design. Some factors may be more pronounced in the design than others in various applications such as a vehicle. For example, the desired frequency response of a speaker located on an instrument panel in a vehicle usually is different from the desired frequency response of a speaker located in the lower portion of a rear door panel. Other factors also may be more pronounced.

Consumer expectations of sound quality are increasing. In some applications, such as a vehicle, consumer expectations of sound quality have increased dramatically over the last decade. Consumers now expect high quality sound systems in their vehicles. In addition, the number of potential audio sources has increased. Audio is available from sources such as radio, compact disc (CD), digital video disc (DVD), super audio compact disc (SACD), tape players, and the like. Furthermore, when a vehicle travels, the signal strength and character of received broadcasts, such as FM radio, vary significantly. As the vehicle changes position with respect to the transmitter, strong stereo signals, weak mono signals, and a continuum of signals with strengths and characters in between may be received. Moreover, many vehicle audio systems employ advanced signal processing techniques to customize the listening environment. Some vehicle audio systems incorporate audio or sound processing that is similar to surround sound systems offered in home theater systems.

Many digital sound processing formats support direct encoding and playback of five or more discrete channels. However, most recorded material is provided in traditional two-channel stereo mode. Matrix sound processors synthesize four or more output signals from a pair of input signals— generally left and right. Many systems have five channels— center, left-front, right-front, left-surround, and right-surround. Some systems have seven or more channels—center, left-front, right-side, left-side, right-side, left-rear, and right-rear. Other outputs such as a separate subwoofer channel may be included.

In general, matrix decoders mathematically describe or represent various combinations of input audio signals in a N×2 or other matrix, where N is the number of desired outputs. The matrix usually includes 2N matrix coefficients that define the proportion of the left and/or right input audio signals for a particular output signal. Typically, these surround sound processors can transform M input channels into N output channels using a M×N matrix of coefficients.

Many audio environments, such as the listening environment inside a vehicle, are significantly different from a home theater environment. Most home theater systems are not designed to operate with the added complexities inside of a vehicle. The complexities include non-optimal driver placement, varying background noise, and varying signal characteristics. A vehicle and similar environments are typically more confined than rooms containing home theatre systems. The speakers in a vehicle usually are in closer proximity to the listener. Typically, there is less control over speaker placement in relation to the listener as compared to a home theater or similar environment, where it is relatively easy to place each speaker the same approximate distance from the listeners.

In contrast, it is nearly impossible in a vehicle to place each speaker the same distance from the listeners when one considers the front and rear seating positions and their close proximity to the doors, as well as the kick-panels, dash, pillars, and other interior vehicle surfaces that could contain the speakers. These placement restrictions are problematic considering the short distances available in an automobile for sound to disperse before reaching the listeners. In many applications within a vehicle, noise is a significant variable. Ambient noise in home theatre systems usually remains relatively constant. However, ambient noise levels in a vehicle can change with speed and road conditions. In addition to noise, the received signal strength, such as of an FM broadcast, varies more as an automobile changes location with respect to the transmission source than in the home environment where the receiver is stationary.

SUMMARY

This invention provides a sound processing system with spatial imaging techniques to reduce the times when only a center speaker would be heard and to reduce the locations where a center speaker would not be heard.

The sound processing system adjusts the gain of the volume setting for individual speakers or sets of speakers in response to one or more input signals, such as the volume setting and the vehicle speed. When the global volume setting is low or the vehicle speed increases, the sound processing system attenuates the gain of the volume setting for the center speaker. In addition or as an alternative, the sound processing system increases the gain of the volume setting for the front and/or rear speakers. The rear speakers may include one or more pairs of rear and/or surround speakers.

The sound processing system also creates a virtual center channel for locations where the center speaker may not be heard. These locations include the rear seats in a vehicle, where the front seats block or otherwise obstruct sound from the center speaker. The sound processing system mixes an input signal for a rear speaker with an input signal for a front speaker and/or an input signal for the center speaker. An all-pass network may be used to further position the virtual center channel.

Other systems, methods, features and advantages of the invention will be, or will become, apparent to one with skill in the art upon examination of the following figures and detailed description. It is intended that all such additional systems, methods, features and advantages be included within the description, be within the scope of the invention, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like references numerals designate corresponding parts throughout the different views.

FIG. 8 is a block diagram or flow chart of a sound processing system.

FIG. 9 illustrates mix ratios for a Logic 7® decoder.

FIG. 10 illustrates mix ratios for a decoder.

FIG. 11 illustrates mix ratios for a discrete decoder.

DETAILED DESCRIPTION OF THE PREFERRED EMBODIMENTS

Figure 1:
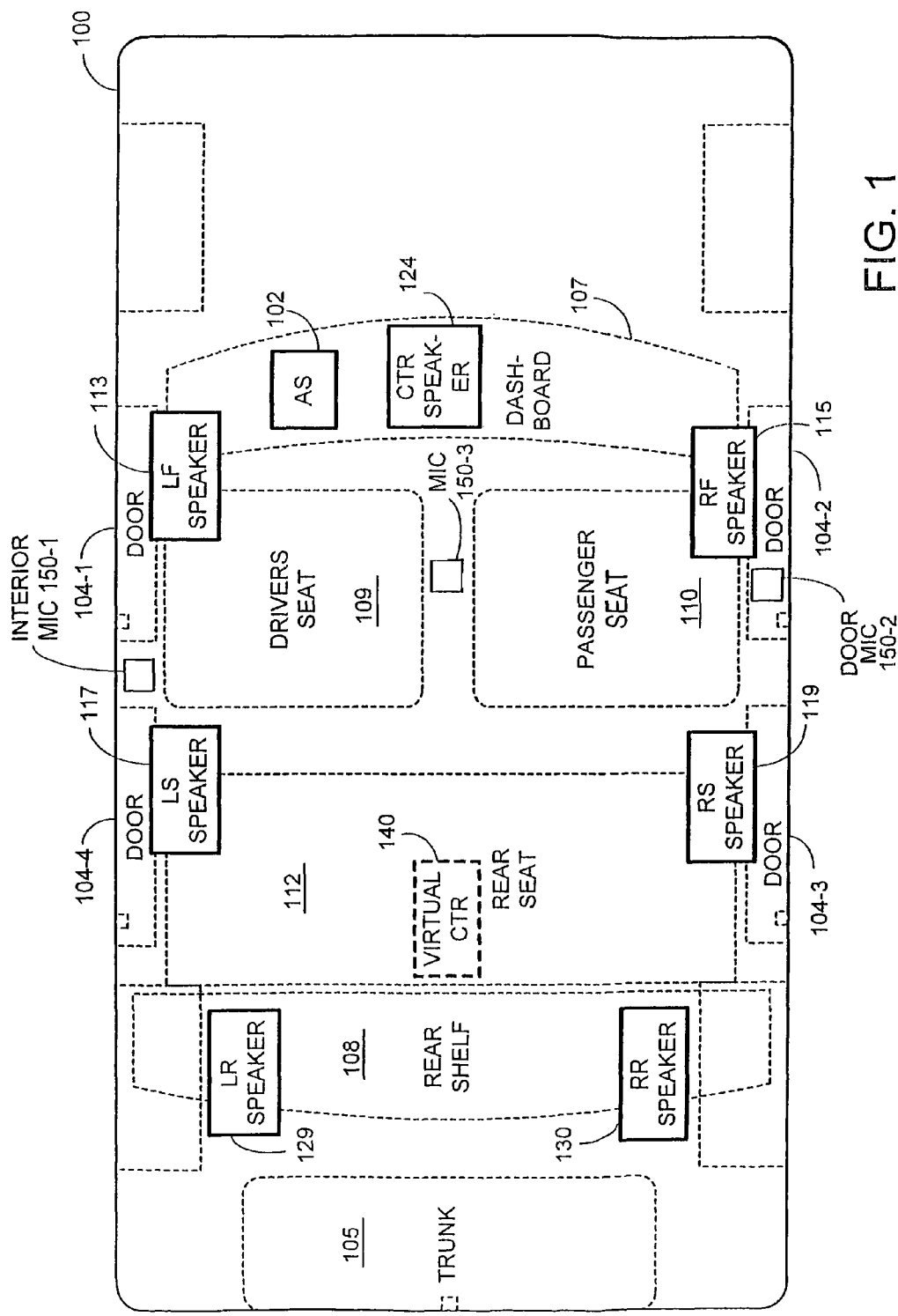
FIG. 1 is a block diagram of a vehicle including a sound processing system.

FIG. 1 is a block diagram of a vehicle 100 including an audio or sound processing system (AS) 102, which may include any or a combination of the sound processing systems and methods described below. The vehicle 100 includes doors 104, a driver seat 109, a passenger seat 110, and a rear seat 111. While a four-door vehicle is shown including doors 104-1, 104-2, 104-3, and 104-4, the audio system (AS) 102 may be used in vehicles having more or fewer doors. The vehicle may be an automobile, truck, boat, or the like. Although only one rear seat is shown, larger vehicles may have multiple rows of rear seats. Smaller vehicles may have only one or more seats. While a particular configuration is shown, other configurations may be used including those with fewer or additional components.

The audio system 102 improves the spatial characteristics of surround sound systems. The audio system 102 supports the use of a variety of audio components such as radios, CDs, DVDs, their derivatives, and the like. The audio system 102 may use 2-channel source material such as direct left and right, 5.1 channel, 6.2 channel, other source materials from a matrix decoder, digitally encoded/decoded discrete source material, and the like. The amplitude and phase characteristics of the source material and the reproduction of specific sound field characteristics in the listening environment both play a key role in the successful reproduction of a surround sound field. The audio system 102 improves the reproduction of a surround sound field by controlling the amplitude, phase, and mixing ratios between discrete and passive decoder surround signals and/or the direct two-channel output signals. The amplitude, phase, and mixing ratios are controlled between the discrete and passive decoder output signals. The spatial sound field reproduction is improved for all seating locations by re-orientation of the direct, passive, and active mixing and steering parameters, especially in a vehicle environment. The mixing and steering ratios as well as spectral characteristics may be adaptively modified as a function of the noise and other environmental factors. In a vehicle, information from the data bus, microphones, and other transduction devices may be used to control the mixing and steering parameters.

The vehicle 100 has a front center speaker (CTR speaker) 124, a left front speaker (LF speaker) 113, a right front speaker (RF speaker) 115, and at least one pair of surround speakers. The surround speakers can be a left side speaker (LS speaker) 117 and a right side speaker (RS speaker) 119, a left rear speaker (LR speaker) 129 and a right rear speaker (RR speaker) 130, or a combination of speaker sets. Other speaker sets may be used. While not shown, one or more dedicated subwoofer or other drivers may be present. Possible subwoofer mounting locations include the trunk 105, below a seat (not shown), or the rear shelf 108. The vehicle 100 also has one or more microphones 150 mounted in the interior.

Each CTR speaker, LF speaker, RF speaker, LS speaker, RS speaker, LR speaker, and RR speaker may include one or more speaker drivers such as a tweeter and a woofer. The tweeter and woofer may be mounted adjacent to each other in essentially the same location or in different locations. LF speaker 113 may include a tweeter located in door 104-1 or elsewhere at a height roughly equivalent to a side mirror or higher and may include a woofer located in door 104-1 beneath the tweeter. The LF speaker 113 may have other arrangements of the tweeter and woofer. The CTR speaker 124 is mounted in the front dashboard 107, but could be mounted in the roof, on or near the rear-view mirror, or elsewhere in the vehicle 100.

Figure 2:
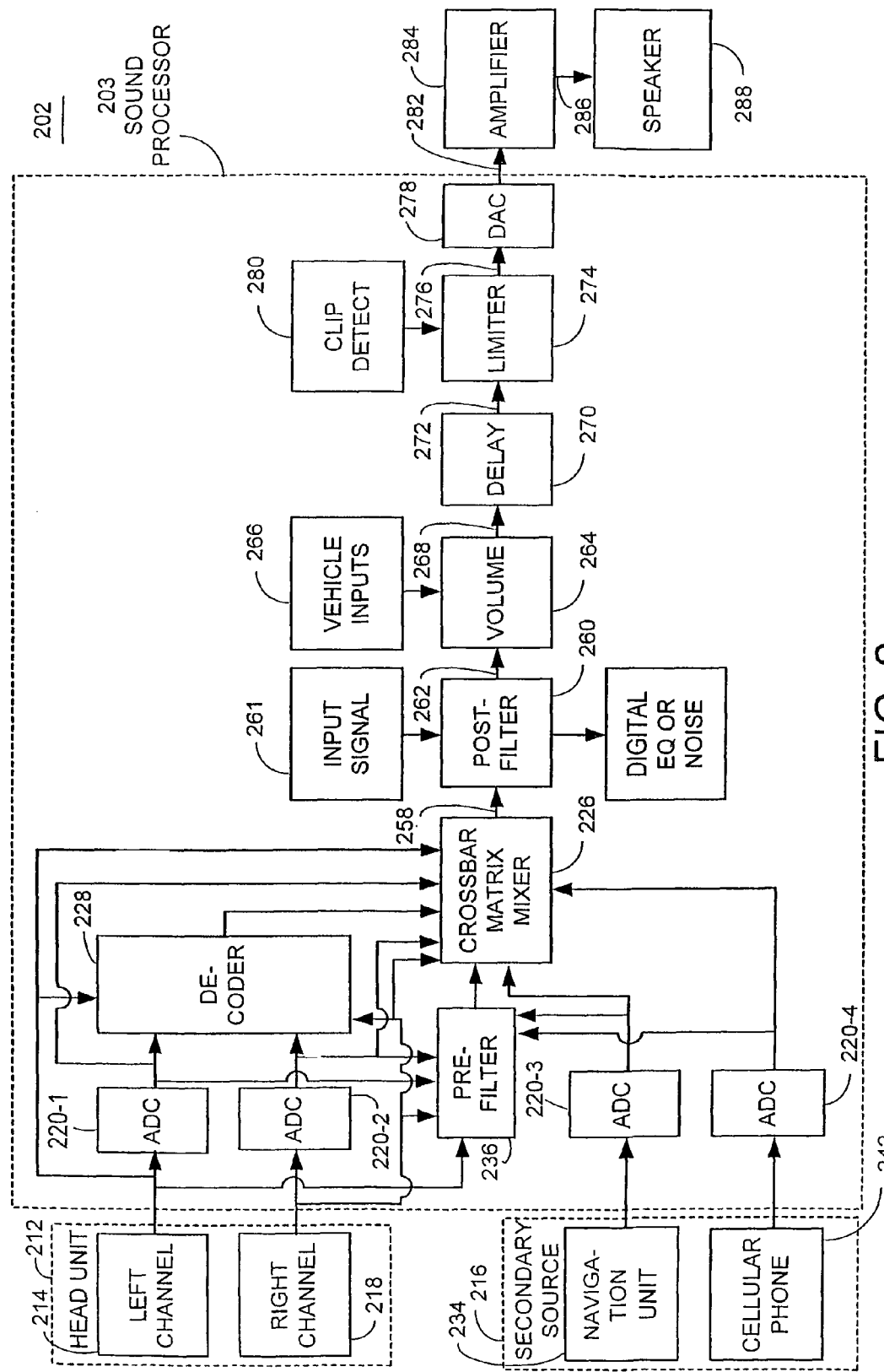
FIG. 2 is a block diagram or flow chart of a sound processing system.

FIG. 2 is a block diagram or a flow chart of a sound processing system 202. In general, a head unit 212 provides a pair of audio signals to a sound processor 203. The head unit 212 may include a radio, a digital player such as a CD, DVD, or SACD, or the like. The audio signals generally are converted into the digital domain and then decoded to produce multiple distinct decoded signals for a crossbar matrix mixer 226. However, the digitally converted audio signals may be provided to the crossbar matrix mixer 226 without decoding. The audio signals may be provided to the crossbar matrix mixer without digital conversion. The audio signals may be filtered or unfiltered. The decoded signals and audio signals (digitally converted or not, filtered or not) are mixed in various proportions using the crossbar matrix mixer 226. The proportions range from one or more of the audio signals (digitally converted or not, filtered or not) to one or more of the decoded signals, including combinations of the audio and decoded signals. Pre-filter 236 may apply additional tone and crossover filtering to the audio signals, as well as volume control and other controls. Sound processor 203 converts the manipulated audio and decoded signals into the analog domain. The analog output is amplified and routed to one or more speakers 288 such as the CTR speaker, LF speaker, RF speaker, LS speaker, RS speaker, LR speaker, and RR speaker as discussed in relation to FIG. 1. While a particular configuration and operation are shown, other configurations and operations may be used including those with fewer or additional components.

In operation, the primary source head-unit 212 generates a left channel 214 and a right channel 218. The left and right channels may be processed similarly or differently. If the audio signals on the left channel 214 and right channel 218 are digital, the audio signals pass directly to pre-filter 236, decoder 228, or crossbar matrix mixers 226. If the audio signals on left channel 214 and right channel 218 are analog, the audio signals pass through one or more analog to digital converters (ADC) 220-1 and 220-2, and then pass to pre-filter 236, decoder 228, or crossbar matrix mixer 226. The pre-filter 236 includes one or more filters (not shown) that may provide conventional filter functions such as allpass (crossover), lowpass, highpass, bandpass, peak or notch, treble shelving, base shelving and/or other audio filter functions. In one aspect, left channel 214 and right channel 218 are input directly into crossbar matrix mixer 226. In another aspect, the left channel 214 and right channel 218 are input to decoder 228. In a further aspect, the left channel 214 and right channel 218 are input to pre-filter 236. Similarly, an optional secondary source 216 provides source signals from navigation unit 234 and cellular phone 242 to analog to digital converters (ADC) 220-3 and 220-4, respectively. These digital source signals are input into crossbar matrix mixer 226 or pre-filter 236.

From the primary-source digital inputs, such as direct from ADC 220-1 and ADC 220-2 or indirect from pre-filter 236, the decoder 228 generates multiple decoded signals that are output to crossbar matrix mixer 226. In one aspect, there are five decoded signals. In another aspect, there are seven decoded signals. There may be other multiples of decoded signals including those for a subwoofer. The decoder 228 may decode inherently digital inputs, such as DOLBY DIGITAL AC3® or DTS® signals, into multi-channel outputs. The decoder 228 may decode encoded 2-channel inputs, such as Dolby Pro Logic I®, Dolby Pro Logic II®, or DTS Neos 6® signals, into multi-channel outputs. The decoder 228 may apply other decoding methods, such as active matrix, to generate multi-channel outputs. Inherently digital inputs can result in 5.1 output—LF (left-front), CTR (center), RF (right-front), LR (left-rear), RR (right-rear), and LFE (low frequency). Inherently digital inputs also can result in 6.2 outputs—LF, CTR, RF, LS (left-side), RS (right-side), LR, RR, left LFE, and right LFE. Inherently digital inputs can result in other outputs. Similarly, an active matrix processed 2-channel input can result in 4.0 output—LF, CTR, RF, and S (surround)). The channels output by these types of decoders are referred to as discrete. Other multi-channel outputs may result.

In addition to the audio and secondary source signals, the outputs from decoder 228 can be input to crossbar matrix mixer 226. The crossbar matrix mixer 226 outputs two or more summed signals 258. In one aspect, there are four or more output signals 258. There may be other multiples of output signals. The crossbar matrix mixer 226 may include individual channel inputs and may include virtual channel processing. The virtual channels may be further utilized to process any signal presented in the crossbar matrix for various complex sound effects.

Mixed output signals 258 from crossbar matrix mixer 226 are input to post-filter 260, which includes one or more digital filters (not shown) that provide conventional filter functions such as allpass, lowpass, highpass, bandpass, peak or notch, treble shelving, base shelving, other audio filter functions, or a combination. The filtration performed by post-filter 260 is in response to input signal 261, which may include: vehicle operation parameters such as a vehicle speed and engine revolutions-per-minute (RPM); sound settings such as tone level, bass level, treble level, and global volume from the head unit 212; input sound pressure level (SPL) from interior microphones 150-1, 150-2, and/or 150-3 (see FIG. 1); or a combination. In one aspect, a two channel filter 236 is placed before the decoder 228. In another aspect, a multi-channel post-filter 260 is placed after the crossbar matrix mixer 226 for use with digital decoders that process DOLBY DIGITAL AC3® and DTS® signals. The multi-channel post-filter 260 may have three or more output channels.

An output 262 of filter 260 is connected to a volume gain 264. Volume gain 264 applies global volume attenuation to all signals output or localized volume attenuation to specific channels. The gain of volume gain block 264 is determined by vehicle input signals 266, which are indicative of vehicle operation parameters. In one aspect, vehicle input signals 266 include vehicle speed provided by a vehicle data bus (not shown). In another aspect, vehicle input signals 266 include vehicle state signals such as convertible top up, convertible top down, vehicle started, vehicle stopped, windows up, windows down, ambient vehicle noise (SPL) from interior microphone 150-1 placed near the listening position, door noise (SPL) from door microphone 150-2 placed in the interior of a door, and the like. Other input signals such as fade, balance, and global volume from the head unit 212, the navigation unit 234, the cellular phone 242, or a combination may be used.

An output 268 of volume gain 264 is input to a delay 270. An output 272 of delay is input to a limiter 274. An output 276 of the limiter 274 is input to a digital to analog (DAC) converter 278. The limiter 274 may employ clip detection 280. An output 282 of the DAC 278 is input to an amplifier 284. An output 286 of the amplifier 284 is input to one or more speakers 288.

While operating in the digital domain, the sound processing system 202 can decode digitally encoded material (DOLBY DIGITAL AC3®, DTS®, and the like) or originally analog material, such as monaural, stereo, or encoded tracks that are converted into the digital domain. To decode these analog signals, the decoder can employ one or more active matrix decoding techniques, including DOLBY PRO LOGIC® or LOGIC 7®, and various environment effects, including hall, club, theater, etc. For active matrix decoding, the decoder converts the left and right channel inputs to center, left, right, and surround channel outputs. Optionally, the decoder can output a low-frequency channel, which is routed to a subwoofer.

Active matrix decoding applies digital processing techniques to significantly increase the separation between the center, left, right, and surround channels by manipulating the input signals. In one aspect, active matrix channel separation is about 30 db between all four channels. Active matrix processing can be employed where coefficients change with time, source, or any other parameter. Virtual center channels can be synthesized from left and right speakers.

Passive matrix processing uses a resistive network to manipulate analog input signals. Passive matrix processing also may be achieved in the digital domain from digitized input. Passive matrix processing may be implemented in the crossbar matrix mixer 226 or elsewhere in the sound processing system. Passive matrix processing may be used without active matrix processing, as in systems without a surround sound decoder, or in combination with a surround sound decoder. In one aspect, the user selects between active decoding or passive processing. In another aspect, the processing system selects the type of processing based on the audio signals.

In addition to its use in an automobile, passive matrix processing of a digitized signal is beneficial in home and automobile environments and especially for degraded signals as described below. Unlike active matrix processing, which can achieve 30 db of separation between the channels, passive matrix processing generally has >40 db of separation between the left and right and center and surround channels, but only about 3 db of separation between adjacent channels, such as the left/right and center, and left/right and surround. In this respect, active matrix processing achieves about an order of magnitude greater separation than passive matrix. Unlike an active matrix system which will route monaural signals only through the center channel, passive matrix processing results in all speakers passing the audio signal. Thus, passive matrix processing may be used to reduce slamming and other undesirable effects of stereo to mono blending for sources including amplitude modulation (AM) radio, frequency modulation (FM) radio, CD, and cassette tapes.

To accomplish passive matrix processing in the digital domain, the crossbar matrix mixer 226 mixes N output channels from the left and right audio input channels 214 and 218. The passive matrix includes matrix coefficients that do not change over time. In one aspect, N is equal to five or seven. When N is equal to five, the vehicle sound system preferably includes left front (LF), right front (RF), right side (RS) or right rear (RR), left side (LS) or left rear (LR) and center (CTR) speakers. When N is equal to seven, the vehicle sound system has both side and rear speaker pairs.

To increase the tonal qualities of reproduced sound, whether from a surround sound processor or otherwise, distortion limiting filters may be used. Sound processing system 202 may incorporate one or more distortion limiting filters in the pre-filter 236 or post-filter 260. In one aspect, these filters are set based on vehicle state information and user settings in addition or in-lieu of the properties of the audio signal itself.

At elevated listening levels, sound distortion increases. This increase may be in response to the applied filter gain (loudness compensation) or other sources, such as amplifier clipping or speaker distortion. By applying filter attenuation at a predetermined or high volume level, sound quality may be increased. A predetermined volume level can be a global volume setting preset by the manufacturer or selected by a user of the sound processing system. The predetermined volume level also can be a sound pressure level as discussed. A higher or elevated volume level is when the global volume setting exceeds a high volume threshold. This attenuation may be applied to signals with previously applied filter gain or the "raw" signal. Attenuation may be accomplished by coupling the treble shelf, base shelf, or notch filter (or any combination of these filter functions or others) to the global volume position, and engaging the attenuation filters as desired.

In a similar fashion, sound quality may also be improved at predetermined or elevated listening levels by tone filter attenuation. This attenuation may be applied to previously tone compensated signal or the "raw" signal. Tone filter attenuation may be incorporated into filter block 236 or 260. The attenuation may be accomplished by coupling one or multiple filters (treble shelf, base shelf, notch, or others) to the bass, treble, or midrange tone controls, and engaging the attenuation filters as desired.

While these attenuations can be made solely on the basis of the position of the global volume and/or and tone controls, attenuation may also be applied by dynamically compensating the amount of attenuation through the use of SPL information provided by an in-car microphone, such as the interior microphone 150-1 (see FIG. 1).

In another aspect, the crossbar matrix mixer 226 performs adaptive mixing to alter the inter-channel mixing ratios, steering angles, and filter parameters between the discrete channel outputs from decoder 228 to improve spatial balance and reduce steering artifacts. Spatial balance can be thought of as the evenness of the soundstage created and the ability to locate specific sounds in the soundstage. Steering artifacts may be thought of as audible discontinuities in the soundstage, such as when you hear a portion of the signal from one speaker location and then hear it shift to another speaker location. Also, if the steering angles are overly aggressive, you can hear over-steering, or "pumping," which changes the volume of the signal. The mixer can mix direct, decoded, or passively processed signals with discrete, non-steered, or partially-steered signals to improve the spatial balance of the sound heard at each passenger location. This improvement can be applied to music signals, video signals, and the like.

Figure 3:
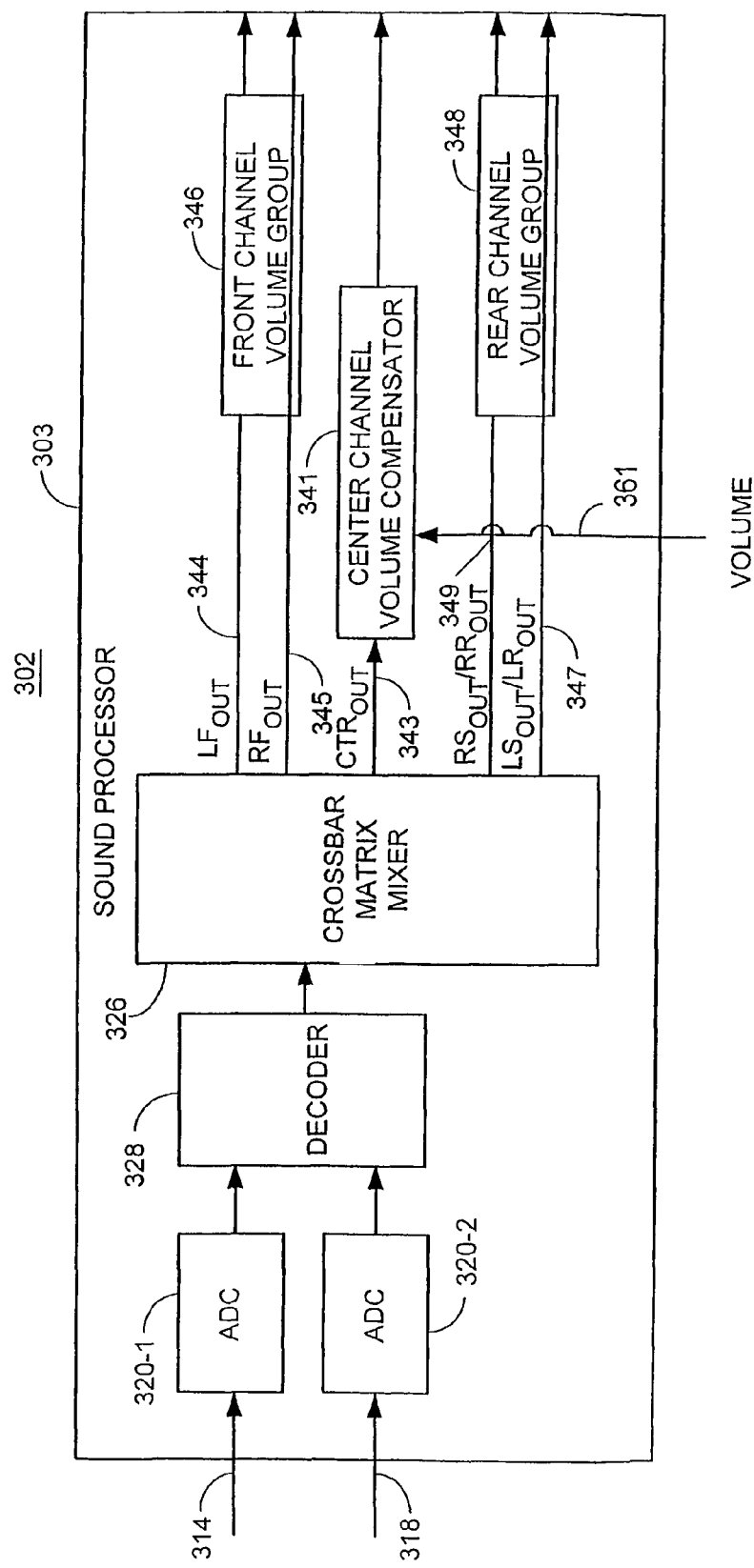
FIG. 3 is a block diagram or flow chart of a sound processing system.

FIG. 3 is a block diagram or flow chart of a sound processing system 302. The sound processing system 302 has a sound processor 303 that receives left and right channel signals 314 and 318 from a head-unit or other source (not shown). The left and right channel signals 314 and 318 are input to analog-to-digital converters (ADC) 320-1 and 320-2. Outputs of the ADC 320-1 and 320-2 are input to a decoder 328. Outputs of the decoder 328 are input to a crossbar matrix mixer 326, which generates the $LF_{out}$, $RF_{out}$, $RS_{out}/RR_{out}$, $LS_{out}/LR_{out}$, and $CTR_{out}$ output signals 344, 345, 346, 347 and 343, respectively. $CTR_{out}$ signal 343 is output to a center channel volume compensator 341, which also receives a volume input 361 from a head unit or another source such as a vehicle data bus. The center channel compensator 341 reduces the gain of the center channel for low volume settings in relation to the left and right outputs ($LF_{out}$, $RF_{out}$, $RS_{out}$, $LS_{out}$, $RR_{out}$, and $LR_{out}$). Low volume settings are when the global volume setting is equal or less than a threshold volume, which may be predetermined or correlated to another parameter.

Figure 4:
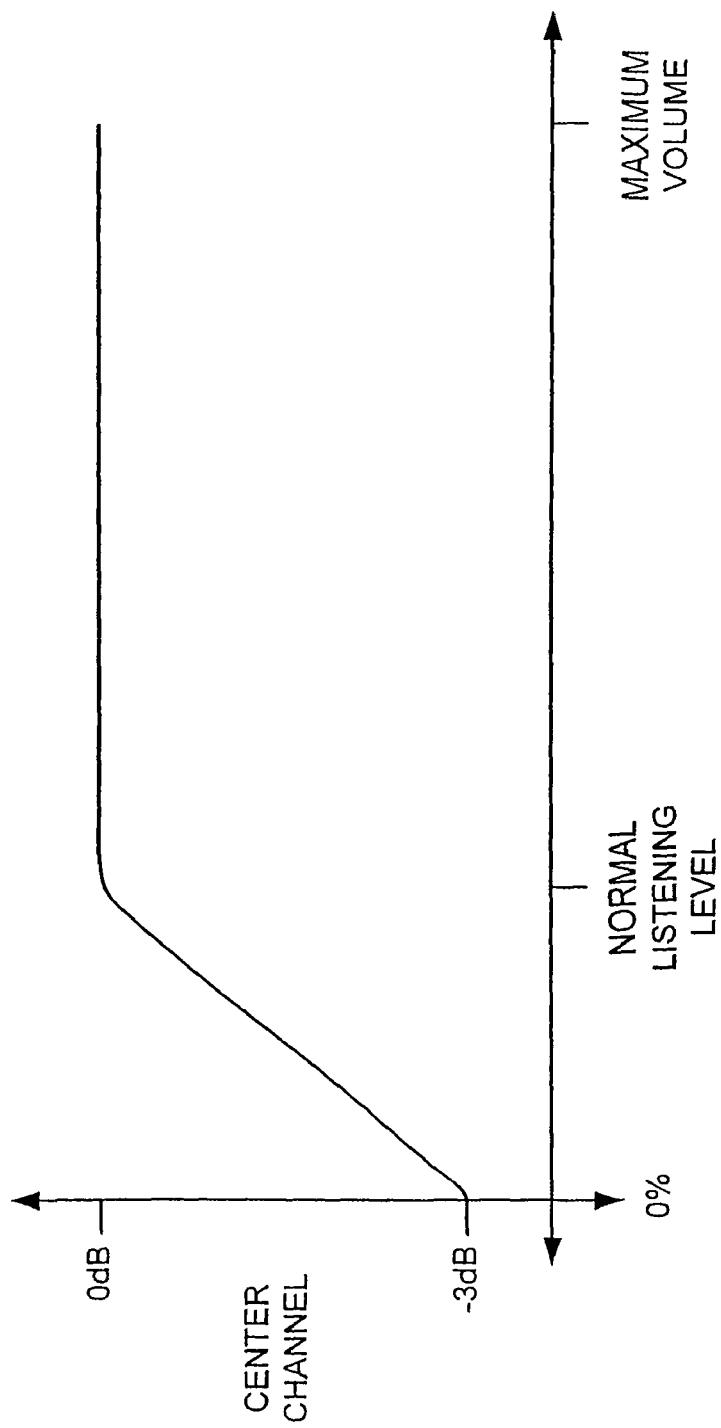
FIG. 4 is a graph illustrating a suggested center channel volume attenuation curve for global low volume (below normal) listening.

FIG. 4 is a graph illustrating a suggested center channel gain/volume relationship. There may be other center channel gain/volume relationships. The center channel volume compensator 341 (see FIG. 3) provides attenuation of the center channel for low global volume levels. More particularly, the center channel volume compensator 341 attenuates the center channel for lower than normal listening levels. Without attenuation at low global volume settings, the music sounds like it emanates only from the center speaker. The center speaker essentially masks the other speakers in the audio system. By attenuating the center speaker at lower global volume levels, improved sound quality is provided by the sound processor 302. The music sounds like it emanates from all the speakers.

In a similar fashion, front and rear channel volume compensators 346 and 348 (see FIG. 3) may be used to increase the volume on the LF, RF, LS, LR, and RS, RR speakers 113, 115, 117, 129, 119, and 130 in relation to the center speaker 124 (see FIG. 1). By increasing the left and right channel volume in relation to center channel volume, a similar low global volume level compensation effect is achieved. In contrast to the center channel volume compensator 341, the volume compensation curve applied to the front and rear channels could be the inverse of that shown in FIG. 4.

Figure 5:
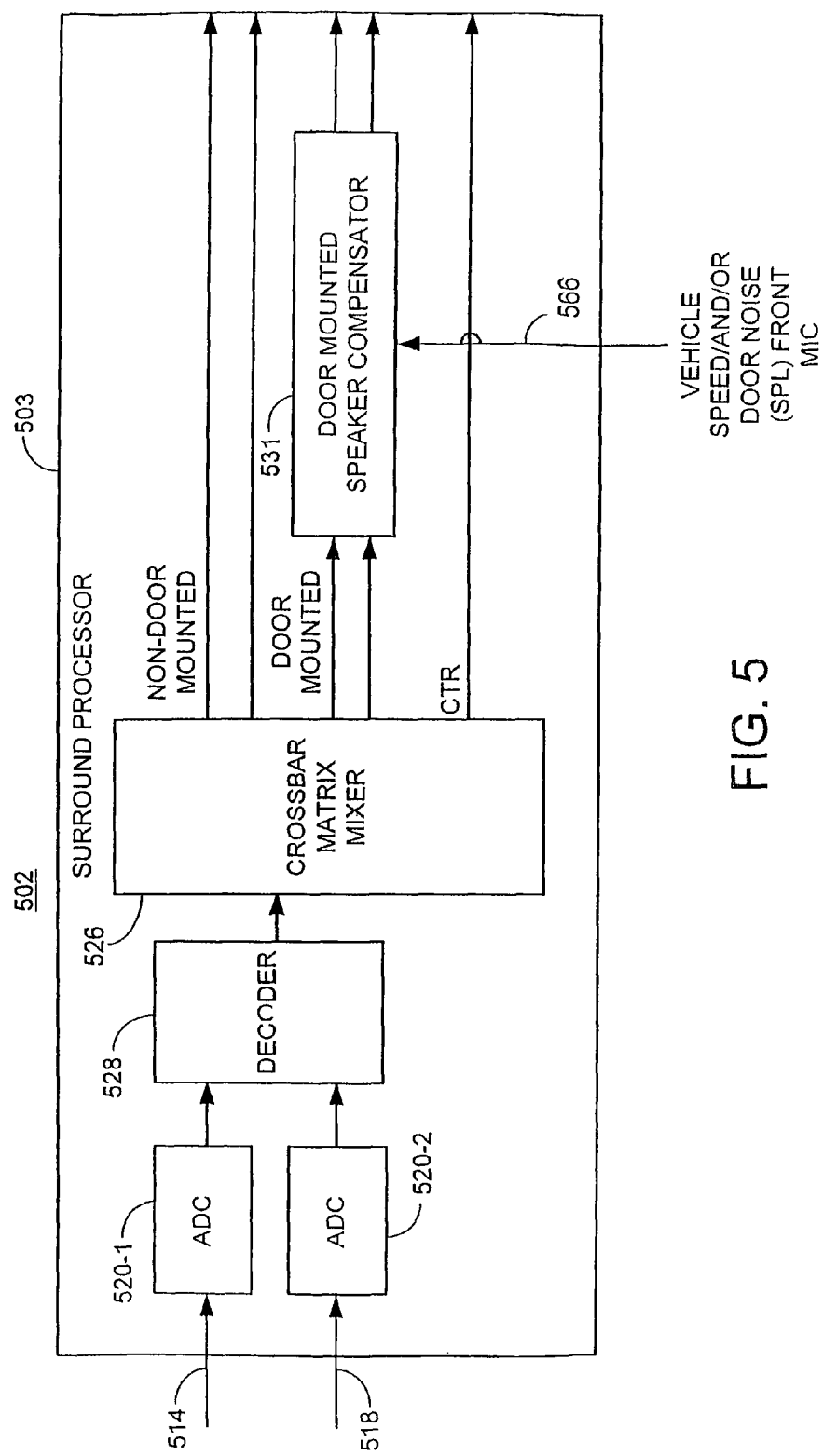
FIG. 5 is a block diagram or flow chart of a sound processing system.

FIG. 5 is a block diagram or flow chart of a sound processing system 502 is shown that adjusts for variations in background sound pressure level (SPL). As speed increases, the background SPL and road noise increase. The road noise tends to mask or cancel sound coming from door-mounted speakers. The sound processing system 502 applies additional gain to the door-mounted speakers as a function of the vehicle operation parameters such as speed, the SPL measurements from an interior microphone such as the door mounted microphone 150-2 or the interior microphone 150-1 (see FIG. 1), or a combination.

The sound processing system 502 receives left and right channel signals 514 and 518 from a head unit or other source (not shown). The left and right channel signals 514 and 518 are input to analog to digital converters (ADC) 520-1 and 520-2. Outputs of ADC's 520-1 and 520-2 are input to decoder 528. Outputs of the decoder 528 are input to a crossbar matrix mixer 526. The crossbar matrix mixer 526 generates LF, RF, LS/LR, RS/RR, and CTR output signals. The signals that are sent to door-mounted speakers are adjusted to account for changes in the SPL. The door-mounted speakers may be the LF and RF only, the LS and RS only, or the LF, RF, LS, and RS, or another combination of speakers. In one aspect, the LF and RF speakers may be in the doors and the LR and RR are in the rear deck. In another aspect, the LF and RF speakers may be in the kick panels, and the LS, RS, LR and RR speakers are door-mounted. In a further aspect, the LF, RF, LR, and RR speakers are all in the doors. The CTR speaker is not door-mounted. In yet a further aspect, a single surround speaker is mounted in the rear shelf 108 (see FIG. 1).

The outputs of the crossbar matrix mixer 526 that are associated with door-mounted speakers are output to a door-mounted speaker compensator 531. The door-mounted compensator 531 also receives vehicle status input 566, which may be received from a vehicle data bus or any other source. The vehicle status input 566 may be the vehicle speed, the door noise, and the like. By providing additional gain as a function of vehicle speed to the door-mounted speakers, audio quality is improved. In one aspect, the compensator 531 may receive a SPL signal in real-time from a microphone 150-2 mounted in the interior of a door or microphone 150-1 mounted in the interior of the vehicle. In this manner, volume correction may be applied as a function of vehicle speed and door SPL levels, or SPL level alone.

Figure 6:
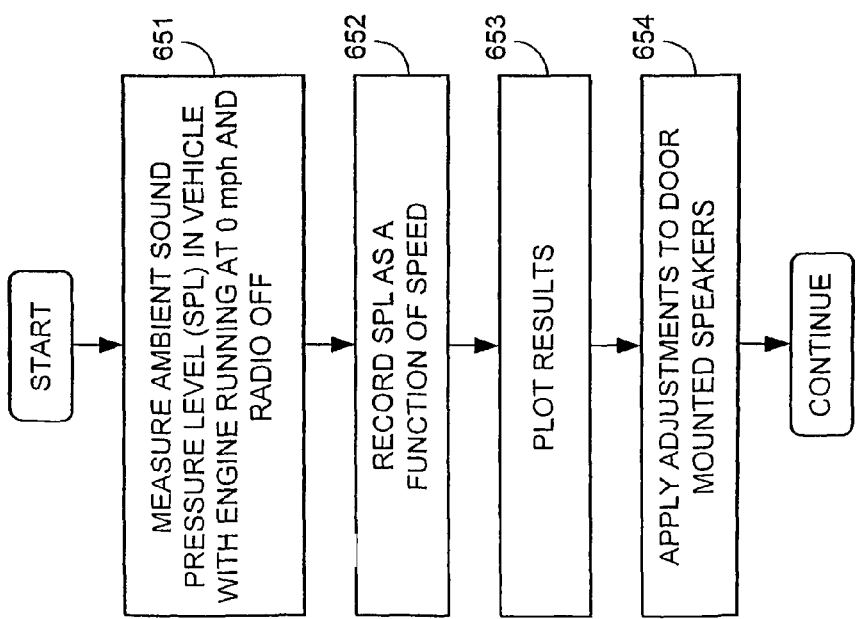
FIG. 6 is a flow chart of a method for establishing a relationship between the sound pressure level (SPL) and speed in a sound processing system.

FIG. 6 is a flow chart of a method for establishing a relationship between sound pressure level (SPL) and vehicle speed in a sound processing system. Ambient SPL is measured 651 in the vehicle with the engine running at 0 mph and with the head unit and other audio sources turned off. The SPL is recorded 652 as a function of speed. The results are plotted 653. Linear, non-linear, or any other form of curve fitting may be employed on the measured data. Adjustments are applied 654 to door-mounted speakers.

Figure 7:
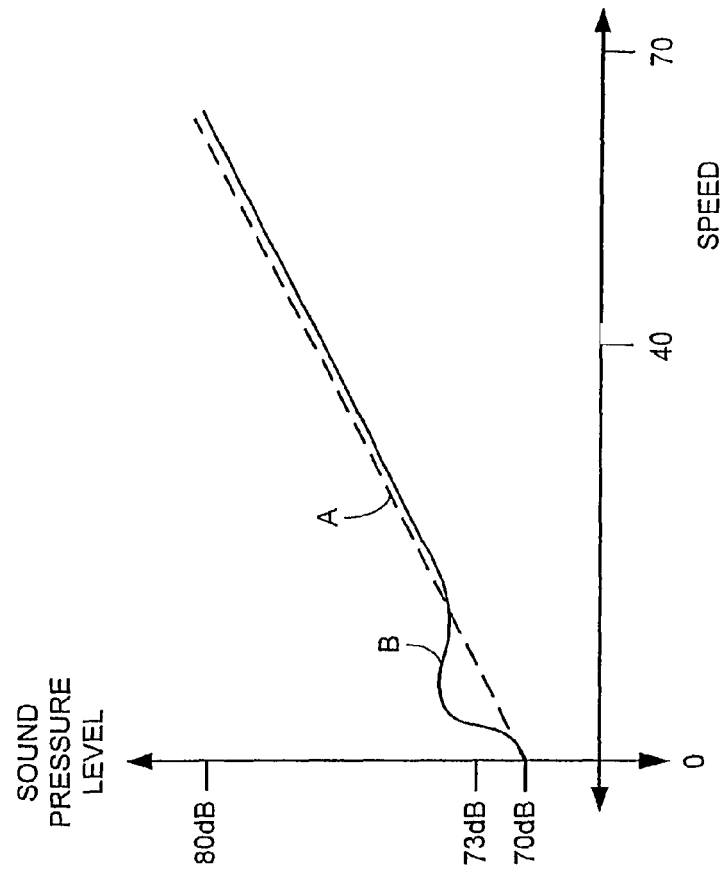
FIG. 7 is a graph illustrating an SPL and speed relationship.

FIG. 7 is a graph illustrating an SPL to vehicle speed relationship. Dotted line A shows uncorrected gain for all speakers as a function of speed. Solid line B shows corrected gain for door-mounted speakers. The door-mounted speaker compensator 531 (see FIG. 5) employs the corrected gain for door-mounted speakers to improve audio quality.

FIG. 8 is a block diagram or flow chart of a sound processing system 802 having a virtual center channel. FIG. 9 illustrates mix ratios for a Logic7® decoder. FIG. 10 illustrates alternate mix ratios for a decoder. FIG. 11 illustrates mix ratios for a discrete decoder. The sound processing system 802 generates a virtual center channel 140 (see FIG. 1) for rear seat occupants. Usually, there is no center speaker in the rear of a vehicle. Additionally, the front seats tend to block the sound from the center speaker reaching rear seat occupants. This problem is more apparent in vehicles having multiple rows of seating such as sport utility vehicles and vans. In one aspect, a virtual center channel is created by modifying the ratios of direct and actively decoded or passively processed signals. The steering, gain, and/or signal delay for selected audio channels may also be modified. In another aspect, the sound quality of the virtual center channel may be improved by utilizing various mix ratios of decoded, passive matrix processed, and direct signals singularly or in combination that are processed with band limited first to fourth order all-pass filters (crossovers).

In FIG. 9, crossbar matrix mixer 826 generates the virtual rear seat center channel 140 using the $LS_{IN}$ and $RS_{IN}$ signals in combination with either the $LF_{IN}$ and $RF_{IN}$ signals. The crossbar matrix mixer 826 generates the virtual rear center speaker 140 by mixing 60% $LS_{EN}$ with 40% $LF_1N$ and by mixing 60% $RS_{IN}$ with 40% $RF_{IN}$. Other mix ratios may be used. The $LF_{IN}$ and $RF_{IN}$ signals could be the direct left and right channel signals that do not pass through the decoder. The left and right channel signals contain sufficient information to generate the virtual center channel for use with typical stereo reproduction and to generate the modified signals to alter the side and rear signals.

In FIG. 10, the crossbar matrix mixer 826 also generates the virtual rear seat center channel 140 using the $LS_{IN}$ and $RS_{IN}$ signals in combination with either the $LF_{IN}$ and $RF_{IN}$ signals or the $CTR_{IN}$ signal. However, the crossbar matrix mixer 826 generates the virtual rear center speaker 140 by mixing 80% $LS_{IN}$ with 20% $LF_{IN}$ and by mixing 80% $RS_{IN}$ with 20% $RF_{IN}$. In one aspect, these mix ratios are used when either or both $LF_{IN}$ and $RF_{IN}$ have strong CTR components. Other mix ratios may be used. Some decoders have significant center channel interaction that bleeds into $LF_{IN}$ and $RF_{IN}$. For these decoders, the $LF_{IN}$ and $RF_{IN}$ signals alone may be used to generate the phantom center.

In FIG. 11, the crossbar matrix mixer 826 generates the virtual rear center speaker 140 by mixing $LS_{IN}$ and $CTR_{IN}$ and by mixing $RS_{IN}$ and $CTR_{IN}$ signals. The crossbar matrix mixer 826 generates the virtual rear center speaker 140 by mixing 80% $LS_{IN}$ with 20% $CTR_{IN}$ and by mixing 80% $RS_{IN}$ with 20% $CTR_{IN}$. Other mix ratios may be used. In addition, the mix ratio may vary depending upon the particular vehicle and/or audio system.

Referring to FIG. 8, the RS and LS outputs pass through an allpass network 810. When created, the virtual rear seat center channel may not image well. In other words, the virtual rear channel may sound like it emanates from a source that is positioned low in the vehicle especially if generated from low-mounted door speakers. The center soundfield image is "blurred" and not reproduced at the location intended. Allpass networks improve the imaging and stability of the virtual center, making the listener believe the center sound stage is located higher in the vehicle such as nearer ear level.

The RS and LS outputs pass through an allpass network 825. Due to space requirements in a vehicle, the size (diameter and depth) of the CTR speaker may be restricted in comparison to the front and rear door speaker locations. With a smaller size, the CTR channel speaker is not capable of reproducing the lower frequencies as well as the larger door speakers. The resulting effect of this restriction causes a "spatial blurring" of the CTR speaker sound image as the CTR signal transcends from high to low frequencies or vice-a-versa. By processing either a portion (as defined by frequency bandwidth and or mixing level) or all of the LF and RF signals through an allpass network, the CTR channel's lower frequencies are perceived as emanating from the smaller CTR speaker. The imaging and stability of the center channel lower frequencies are improved.

Traditional surround sound processors produce low quality sound from mono and mixed mono-stereo signals. As the system switches between stereo and mono reception due to degraded signal strength, the decoders create a "slamming" effect between the center and other channels. Slamming occurs when the stereo signal, which is being sent to all the speakers, degrades to a monaural signal, and is only sent to the center speaker. The listener perceives the sound to rapidly transition, or slam, from throughout the vehicle to only the front-center of the vehicle, and back to throughout the vehicle, as the signal switches from stereo, to mono, and back to stereo.

Figure 12:
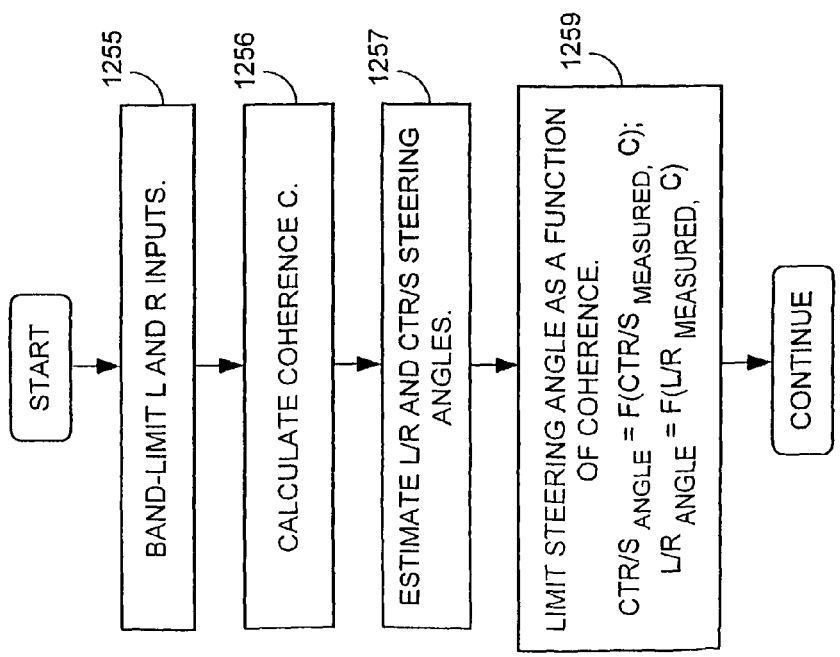
FIG. 12 is a flow chart of a method for estimating coherence in a sound processing system.

FIG. 12 is a flow chart of a method for estimating coherence in a sound processing system. Coherence is the proportion of stereo and monaural signals in the incoming audio signals. In response to this coherence estimator, the degree or steering of active matrix decoding is reduced during the processing of mixed monaural-stereo or monaural only signals. While reducing the amount of applied steering decreases the sound quality in comparison to fully steered stereo signals, steering reduction is preferable to slamming and other acoustic abnormalities that often result from fully steering mixed or monaural signals.

To establish a coherence value using the coherence estimator, the left and right channel inputs are band-limited 1255. A value of 0 is assigned to a pure stereo signal (no signal overlap between channels) and a value of 1 is assigned to a pure monaural signal (complete overlap between channels). Values between 0 and 1 are assigned to mixed monaural/stereo signals in direct proportion to their stereo versus monaural character. The coherence C is calculated 1256. Estimates of steering angles for the left channel output verses the right channel output and for the center channel output verses the surround channel output are determined 1257. The center verses surround and the left verses right steering angles are limited 1259 as a function of the calculated coherence value C.

By continually limiting the steering angle as a function of the stereo/mono character of the received signal, the system transitions between full active steering verses limited steering angle processing. Through continuous updating of the coherence value, steering angles are continually optimized for the available received signal. By smoothing the steering angle transitions, slamming is reduced.

In one aspect, the coherence value C is defined as follows:

$$C = P^2_{LR}/P_{LL}*P_{RR} = \text{coherence, where:}$$

$P_{LL}$=power of left input signal;
$P_{RR}$=power of right input signal; and
$P_{LR}$=cross-power of left and right input signals.

Thus, when C=1.0, the source is pure monaural, and when C=0.0, the source is pure stereo.

When the low-frequency bass content of signals, even those that are otherwise purely stereo, contains an overlap in the bass frequencies due to the non-directional character of base frequencies, the coherence estimator first band-limits the left and right input signals before calculating the coherence value. In this fashion, the coherence estimate is not skewed by music with large bass content.

The active matrix decoder may be designed so that when center signal/surround signal=left signal/right signal=0, the matrix from the decoder collapses to:

$$LF_{out}=L_{in}, RF_{out}=F_{in}, LS_{out}=L_{in},$$

$$RS_{out}=R_{in}, CTR_{out}=0.707(L_{in}+R_{in});$$

which is a stereo, non-surround matrix.

Thus, the degree of surround sound enhancement or steering is made a function of the coherence value, where:

$$CTR/S \text{ angle}=f(CTR/S_{measured}, C),$$

$$L/R \text{ angle}=f(L/R_{measured}, C), \text{ and}$$

S is the surround signal.

In one aspect, this function may be implemented as follows:

$$Y_{CTR/S}=(1-\text{alpha})X_{CTR/S}+(\text{alpha})X_{stereo} \text{ if } C>\text{stereo threshold; and}$$

$$Y_{CTR/S}=(1-\text{alpha})X_{CTR/S}+(\text{alpha})X_{monaural} \text{ if otherwise; where}$$

$Y_{CTR/S}$=CTR/S angle passed to decoder for processing,
$X_{CTR/S}$="raw" CTR/S angle measurement,
C=coherence (1.0=mono, 0.0=stereo),
Alpha=a scale factor that is much less than 1.0, such as 0.02 to 0.0001,
$X_{stereo}$=CTR/S stereo steering limit, and
$X_{monaural}$=CTR/S monaural steering limit.

Figure 13:
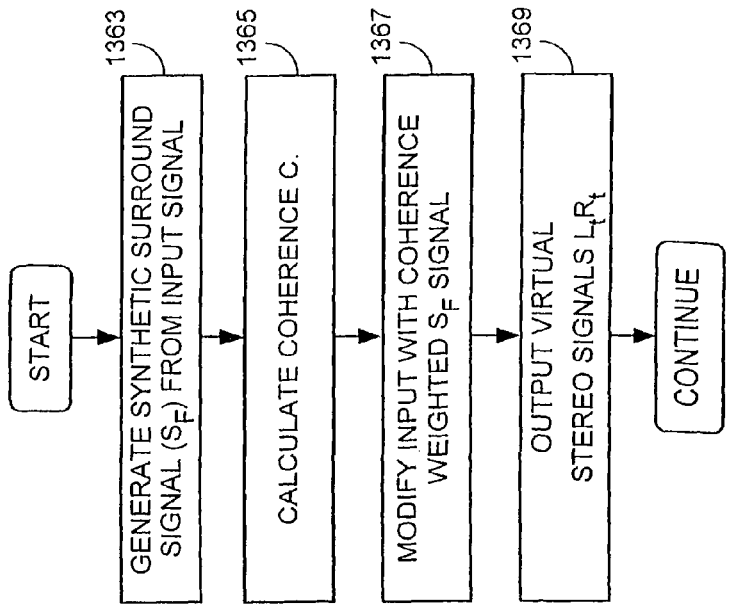
FIG. 13 is a flow chart of a method for spatializing a monaural signal in a sound processing system.

FIG. 13 is a flow chart of a method for spatializing a monaural signal in a sound processing system. In one aspect, the coherence estimator (see FIG. 12) is adapted for use with the monaural spatializer. This monaural spatializer may be used to add ambience to a pure or nearly pure monaural signal. By adding information to monaural feeds, the monaural signals can be processed by an active surround processor such as Dolby Pro Logic I®, Dolby Pro Logic II®, DTS Neos 6® processors, and the like. Thus, monaural sound quality can be improved. While beneficial to the automotive platform, home systems may also benefit from the increased sound quality achieved by actively processing the virtual stereo signals created from pure or nearly pure monaural feeds.

In the monaural spatializer, a synthetic surround (ambiance) signal $S_f$ is continuously formed 1363. In one aspect, $S_f$ can be derived by band-limiting the $L_{raw}$ and $R_{raw}$ input signals to about 7 kHz and above, summing these L and R band-limited signals, and dividing this sum by two. In another aspect the input signals are first summed and divided prior to band-limiting. A coherence estimate value (C) may be continuously calculated 1365 for the L and R input signals as described above. The raw input signals ($L_{raw}$ and $R_{raw}$) are continuously modified 1367 in response to the raw input signals and a weighted sum of the $S_f$ signal formation 1363 and the coherence calculation 1365 to generate virtual stereo signals $L_t$ and $R_t$. The virtual stereo signals $L_t$ and $R_t$ are output 1369 to an active decoder for surround sound processing.

The monaural spatializer may be designed so that from a pure, or nearly pure monaural signal, virtual stereo signals are generated that can produce LF and RF signals that are from about 3 to about 6 db down from the CTR signal, and a surround signal that is about 6 db down from the CTR signal. The virtual stereo signals $L_t$ and $R_t$ may be input to an active decoder. $L_t$ and $R_t$ may be derived from monaural or nearly monaural $L_{raw}$ and $R_{raw}$ signals that are band-limited to about 7 kHz thus generating $L_{bl}$ and $R_{bl}$. The derivation $L_t$ and $R_t$ is as follows:

$$S_f=(L_{bl}+R_{bl})/2;$$

$$L_t=(X*L_{raw})+(Y*S_f*C);$$

$$R_t=(X*R_{raw})+(Y*S_f*C);$$

where $S_f$ is the synthetic surround signal,
$L_{bl}$ and $R_{bl}$ are the band-limited raw input signals,
C is the coherence value between 0.0 and 1.0 as described above,
X is 1.707 or a different weighting factor, and
Y is 0.7 or a different weighting factor.

The weighting factors X and Y may be varied depending on the surround sound effects desired. Thus, if the coherence estimator determines a signal to be purely or nearly pure monaural in character, surround information is added to the signal prior to active decoding. However, as C approaches 0 (pure stereo), the amount of synthetic surround is reduced, thus eliminating virtual stereo in favor of true stereo as the stereo character of the signal increases. Thus, through the combination of the coherence estimator, the monaural spatializer, and active decoding, the sound quality of various monaural and degraded stereo signals may be improved. In addition or in lieu of a coherence estimator, a received signal strength estimator may also be used to alter the degree or steering of active matrix processing.

The sound processing systems are advantageous for automotive sound systems. However, in many instances, they may be beneficially used in a home theater environment. These systems also may be implemented in the vehicle through the addition of add-on devices or may be incorporated into vehicles with the requisite processing capabilities already present.

Many of the processing methods described can be performed in the digital or analog domains. A single digital processing system of sufficient functionality can implement the disclosed embodiments, thus eliminating the requirement for multiple analog and/or digital processors. Such a digital processor can optionally transform any appropriate digital feed, such as from a compact disc, DVD, SACD, or satellite radio. Alternatively, the digital processor can incorporate an analog to digital converter to process an analog signal, such as a signal previously converted from digital to analog, an AM or FM radio signal, or a signal from an inherently analog device, such as a cassette player.

The sound processing systems can process 2-channel source material, and may also process other multiple channels such as, 5.1 and 6.2 multi-channel signals if an appropriate decoder is used. The system can improve the spatial characteristics of surround sound systems from multiple sources.

In addition to digital and analog primary source music signals, the sound processing systems can process sound-inputs from any additional secondary source, such as cell phones, radar detectors, scanners, citizens band (CB) radios, and navigation systems. The digital primary source music signals include DOLBY DIGITAL AC3®, DTS®, and the like. The analog primary source music signals include monaural, stereo, encoded, and the like. The secondary source signals may be processed along with the music signals to enable gradual switching between primary and secondary source signals. This is advantageous when one is driving a vehicle and desires music to fade into the background as a call is answered or as a right turn instruction is received from the navigation system.

While many factors may be considered, two factors that play a role in the successful reproduction of a surround sound field in an automobile are amplitude and the phase characteristics of the source material. The sound processing systems include methods to improve the reproduction of a surround sound field by controlling the amplitude, phase, and mixing ratios of the music signals as they are processed from the head-unit outputs to the amplifier inputs. These systems can deliver an improved spatial sound field reproduction for all seating locations by re-orientation of the direct, passive, or active mixing and steering parameters according to occupant location. The mixing and steering parameters according to occupant location. The mixing and steering ratios, as well as spectral characteristics, may also be modified as a function of vehicle speed and/or noise in an adaptive nature.

While various embodiments of the invention have been described, it will be apparent to those of ordinary skill in the art that more embodiments and implementations are possible that are within the scope of the invention.

The invention claimed is:

1. A sound processing system for a vehicle, comprising:
a crossbar matrix mixer configured to receive a front input signal, a center input signal and a rear input signal;
a center channel volume compensator connected to the crossbar matrix mixer, the center channel volume compensator configured to receive a center output signal from the crossbar matrix mixer; and
at least one of a front channel volume and a rear channel volume compensator connected to the crossbar matrix mixer, the front channel volume compensator configured to receive at least one front output signal from the crossbar matrix mixer, the rear channel volume compensator configured to receive at least one rear output signal from the crossbar matrix mixer; and
where the center channel volume compensator independently and selectively adjusts a volume gain for the center output signal in response to an input signal,
where the front channel volume compensator independently increases the volume gain for the front output signal in response to the input signal,
where the rear channel volume compensator independently increases the volume gain for the rear output signal in response to the input signal, and
where at least one of the front input signal and the center input signal is combined with the rear input signal by the crossbar matrix mixer to synthesize a virtual center channel in a rear seating area of the vehicle.

2. The sound processing system according to claim 1, where the input signal comprises a volume setting of an audio system in a vehicle.

3. The sound processing system according to claim 1, where the input signal comprises a vehicle speed.

4. The sound processing system according to claim 1, where the input signal comprises an ambient noise level in a vehicle.

5. The sound processing system according to claim 1, where the input signal comprises a sound pressure level in a vehicle.

6. The sound processing system according to claim 1, further comprising at least one door-mounted speaker in a vehicle, where the at least one door-mounted speaker receives at least one of the front and rear output signals.

7. The sound processing system according to claim 1, where the at least one front output signal comprises at least one of a left front output signal or a right front output signal, or a combination thereof.

8. The sound processing system according to claim 1, where the at least one rear output signal comprises at least one of a right surround output signal, a right rear output signal, a left surround output signal, or a left rear output signal, or combinations thereof.

9. The sound processing system according to claim 1, further comprising a decoder connected to the crossbar matrix mixer, the decoder configured to provide multiple decoded signals to the crossbar matrix mixer in response to audio signals.

10. The sound processing system according to claim 9, where the decoder generates the front input signal, the center input signal, and the rear input signal.

11. A method for processing sound in a vehicle, comprising:
    attenuating a volume gain for a center signal with a processor in response to an input signal, the input signal being other than an audio signal representative of audible sound;
    increasing the volume gain for at least one front signal with the processor in response to the input signal; and
    creating, with the processor, a virtual center channel for a rear seating area of the vehicle using the center channel signal and the at least one front signal.

12. The method of claim 11, where the input signal is indicative of an operational parameter related to operation of a vehicle.

13. The method for processing sound according to claim 11, further comprising increasing the volume gain with the processor for at least one rear signal in response to the input signal.

14. The method for processing sound according to claim 11, where the input signal indicates a top-up/top-down status of a convertible top.

15. The method of processing sound according to claim 11, where the input signal indicates a vehicle started/vehicle stopped status of a vehicle.

16. A method for processing sound in a vehicle comprising:
    attenuating a volume gain for a center signal with a processor in response to an input signal, the input signal being other than an audio signal representative of audible sound;
    increasing the volume gain for at least one rear signal with the processor in response to the input signal; and
    creating a virtual center channel with the processor using the center channel signal and the at least one rear signal, the virtual center channel created for a rear seating location in the vehicle.

17. The method of claim 16, where the input signal is indicative of an operational parameter related to operation of a vehicle.

18. The method for processing sound according to claim 16, further comprising increasing the volume gain for at least one rear signal with the processor in response to the input signal.

19. The method for processing sound according to claim 16, where the input signal indicates a top-up/top-down status of a convertible top.

20. The method of processing sound according to claim 16, where the input signal indicates a vehicle started/vehicle stopped status of a vehicle.

21. The method of processing sound according to claim 16, where the input signal indicates a windows-up/windows-down status of a vehicle.

22. A method for processing sound in a vehicle, comprising:
    sensing an input signal with a processor;
    selectively adjusting a volume gain for a center signal with a center channel volume compensator in response to the input signal;
    selectively adjusting a volume gain for at least one of a front signal or a rear signal, or combinations thereof, with a respective front channel volume compensator or a rear channel volume compensator in response to the input signal; and
    creating a virtual center channel with the processor using the rear signal and at least one of the front signal or the center signal, the virtual center channel created for a rear seating location in the vehicle.

23. The method of claim 22, where selectively adjusting the volume gain for at least one of a front signal or a rear signal, or combinations thereof, comprises increasing the volume gain of at least one of the front output signal or the rear output signal, or combinations thereof, with respect to the center output signal.

24. The method of claim 22, where sensing an input signal comprises sensing a volume input signal from an audio system in a vehicle.

25. The method of claim 24, where selectively adjusting a volume gain for a center signal comprises attenuating the volume gain of the center signal with respect to at least one of the front output signal or the rear output signal, or combinations thereof, when the volume input signal is equal or less than a threshold volume level.

26. The method of claim 22, where sensing an input signal comprises sensing an ambient noise level in a vehicle.

27. The method of claim 22, where sensing an input signal comprises sensing a sound pressure level in a vehicle.

28. The method of claim 22, where the volume gain for at least one of the front signal or the rear signal is increased with respect to the volume gain for the center signal.

29. A method for processing sound in a vehicle, comprising:
    attenuating a volume gain for a center signal with a processor in response to an input signal that is indicative of a level of ambient noise being experienced by a user in a vehicle; and
    increasing the volume gain for at least one of a front signal or a rear signal, or a combination of the front signal and the rear signal with the processor in response to the input signal; and
    creating a virtual center channel with processor using the rear signal and at least one of the front signal of the center signal, the virtual center channel created for a rear seating location in the vehicle.

30. A method for processing sound in a vehicle, comprising:
    receiving an input signal indicative of a level of ambient noise in a vehicle, a front input signal, a center input signal, and a rear input signal with a processor;
    the processor mixing the rear input signal with at least one of the front input signal and the center input signal based on the input signal; and
    creating a virtual center channel with the processor, the virtual center channel created from the rear input signal mixed with at least one of the front input signal or the center input signal for a rear seating location in the vehicle.

* * * * *